(12) United States Patent
Miki et al.

(10) Patent No.: US 8,338,911 B2
(45) Date of Patent: Dec. 25, 2012

(54) SEMICONDUCTOR DEVICE AND METHOD OF MANUFACTURING THE SAME (75) Inventors: Hiroko Miki, Yokohama (JP); Makoto Wada, Yokohama (JP); Yumi Hayashi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 105 days.

(21) Appl. No.: 13/053,407

(22) Filed: Mar. 22, 2011

(65) Prior Publication Data
US 2011/0309517 A1 Dec. 22, 2011

(30) Foreign Application Priority Data

Jun. 22, 2010 (JP) ................. 201 0-1 41 606

(51) Int. Cl.
*H01L 21/70* (2006.01)
(52) U.S. Cl. ......... 257/510; 257/626; 438/421; 438/622
(58) Field of Classification Search .................. 257/510, 257/513, 522, 622, 626, 758; 438/421, 622, 438/637, 639
See application file for complete search history.

(56) References Cited

U.S. PATENT DOCUMENTS

| | | | |
|---|---|---|---|
| 2006/0183317 A1* | 8/2006 | Noguchi et al. | 438/629 |
| 2006/0211235 A1* | 9/2006 | Usami | 438/618 |
| 2006/0216920 A1* | 9/2006 | Kojima | 438/618 |
| 2009/0085214 A1 | 4/2009 | Wada et al. | |
| 2009/0206491 A1 | 8/2009 | Wada et al. | |
| 2009/0302475 A1 | 12/2009 | Korogi et al. | |
| 2011/0198757 A1* | 8/2011 | Su et al. | 257/764 |
| 2012/0032344 A1* | 2/2012 | Usami | 257/774 |

FOREIGN PATENT DOCUMENTS

JP 2009-194286 8/2009

* cited by examiner

*Primary Examiner* — S. V. Clark
(74) *Attorney, Agent, or Firm* — Turocy & Watson, LLP (57) ABSTRACT In one embodiment, a semiconductor device including a substrate provided with a semiconductor element, and first and second interconnects provided above the substrate, each of the first and second interconnects having a line shape in a plan view, and the first and second interconnects being substantially parallel to each other. The device further includes a first via plug provided above the substrate, electrically connected to a lower surface of the first interconnect on a second interconnect side, and including a first recess part at an upper end of the first via plug under a first region between interconnects, the first region between interconnects being a region between the first interconnect and the second interconnect. The device further includes a via layer insulator provided above the substrate and including the first via plug, and a first trench under the first region between interconnects, the first trench including a region adjacent to the first via plug in a width direction of the first and second interconnects. Furthermore, an air gap is included in the first region between interconnects and in the first trench.

20 Claims, 13 Drawing Sheets

SEMICONDUCTOR DEVICE AND METHOD OF MANUFACTURING THE SAME

CROSS REFERENCE TO RELATED APPLICATION

This application is based upon and claims the benefit of priority from the prior Japanese Patent Application No. 2010-141606, filed on Jun. 22, 2010, the entire contents of which are incorporated herein by reference.

FIELD

Embodiments described herein relate to a semiconductor device and a method of manufacturing the same.

BACKGROUND

As a conventional semiconductor device, there is known a semiconductor device having an interconnect structure in which an air gap is formed between interconnects. In such a semiconductor device, the capacitance between the interconnects can be reduced by the air gap.

DETAILED DESCRIPTION

Embodiments will now be explained with reference to the accompanying drawings.

An embodiment described herein is a semiconductor device including a substrate provided with a semiconductor element, and first and second interconnects provided above the substrate, each of the first and second interconnects having a line shape in a plan view, and the first and second interconnects being substantially parallel to each other. The device further includes a first via plug provided above the substrate, electrically connected to a lower surface of the first interconnect on a second interconnect side, and including a first recess part at an upper end of the first via plug under a first region between interconnects, the first region between interconnects being a region between the first interconnect and the second interconnect. The device further includes a via layer insulator provided above the substrate and including the first via plug, and a first trench under the first region between interconnects, the first trench including a region adjacent to the first via plug in a width direction of the first and second interconnects. Furthermore, an air gap is included in the first region between interconnects and in the first trench.

Another embodiment described herein is a method of manufacturing a semiconductor device, the method including forming a via layer insulator including a via plug above a substrate which is provided with a semiconductor element, and forming a metal film on the via layer insulator. The method further includes patterning the metal film to form a first interconnect electrically connected to the via plug, and to form a second interconnect, and forming a recess part at an upper end of the via plug under a region between interconnects, the region between interconnects being a region between the first interconnect and the second interconnect. The method further includes forming a trench in a region of the via layer insulator under the region between interconnects, and forming an insulating film on the first and second interconnects so that an air gap is included in the region between interconnects and in the trench.

(First Embodiment)
(Configuration of Semiconductor Device)

Figure 1A:
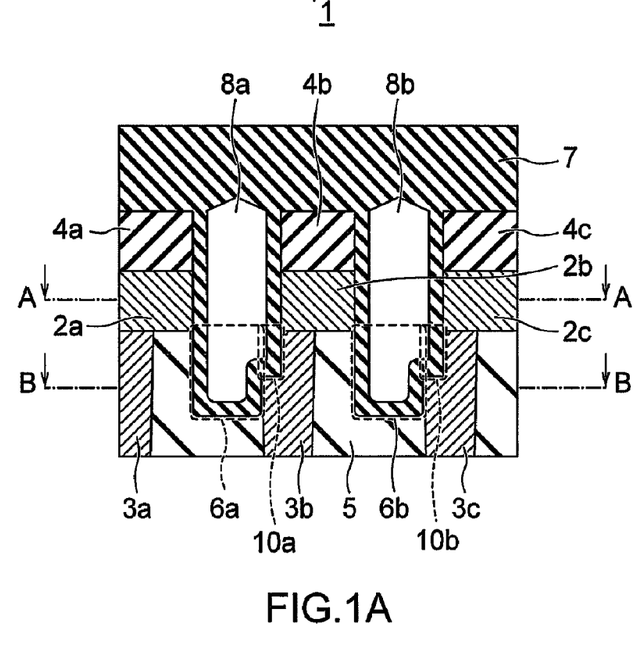
FIGS. 1A and 1B are vertical sectional views illustrating a semiconductor device of a first embodiment.
Figure 1B:
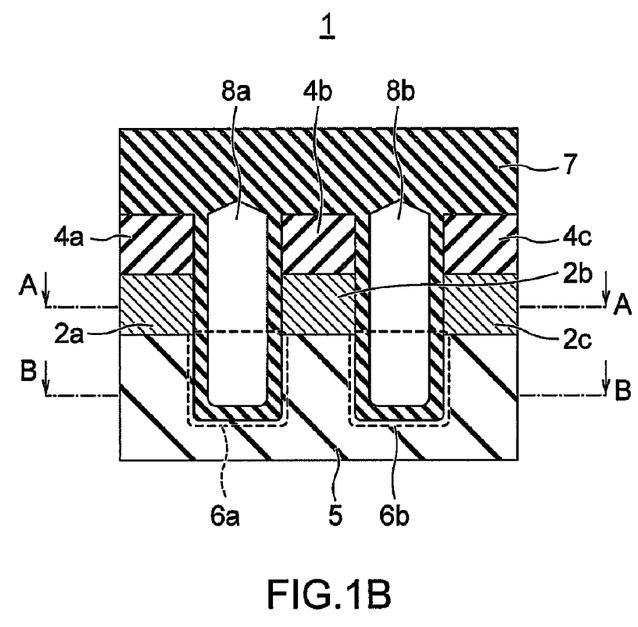
Figure 2A:
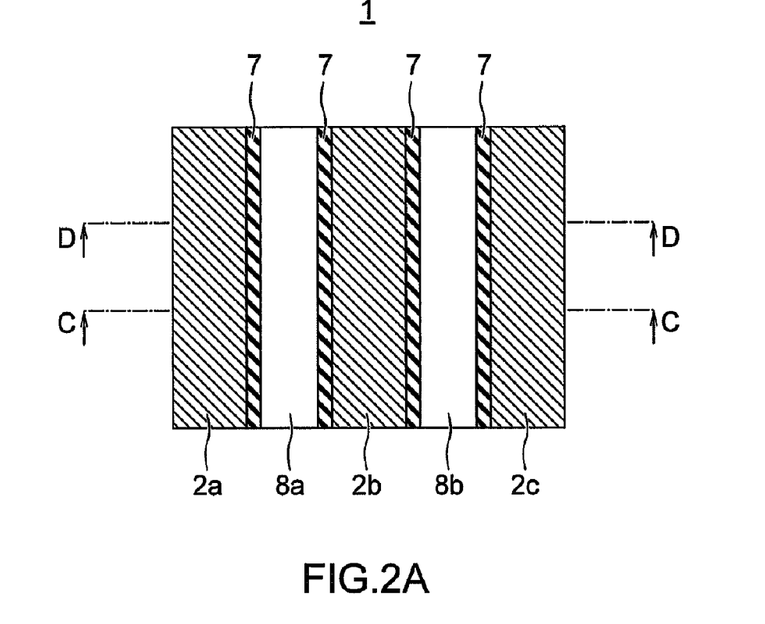
FIGS. 2A and 2B are horizontal sectional views illustrating the semiconductor device of the first embodiment.
Figure 2B:
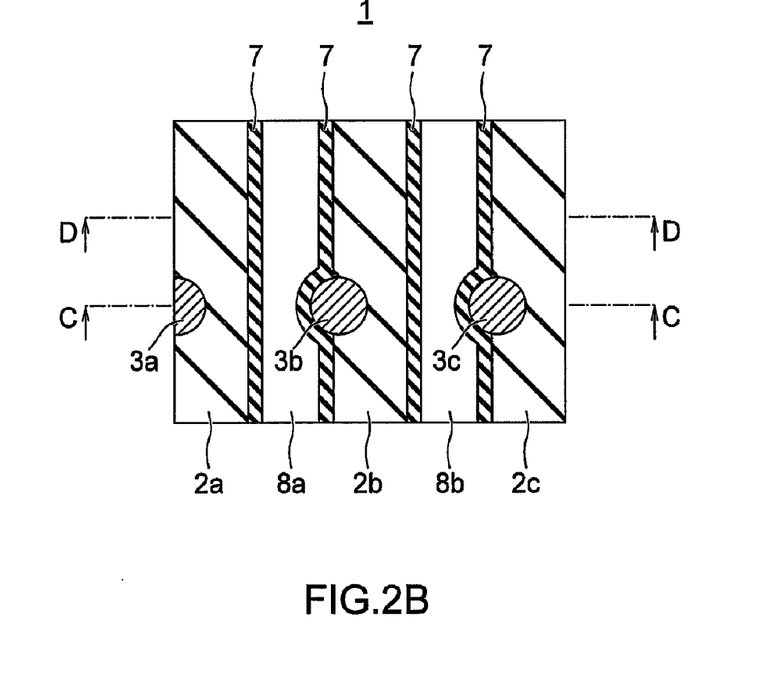

FIGS. 1A and 1B are vertical sectional views illustrating a semiconductor device 1 of a first embodiment. FIGS. 2A and 2B are horizontal sectional views illustrating the semiconductor device 1 of the first embodiment.

A section of the semiconductor device 1 along a line A-A in FIGS. 1A and 1B corresponds to a section shown in FIG. 2A, and a section of the semiconductor device 1 along a line B-B in FIGS. 1A and 1B corresponds to a section shown in FIG. 2B. Furthermore, a section of the semiconductor device 1 along a line C-C in FIGS. 2A and 2B corresponds to the section shown in FIG. 1A, and a section of the semiconductor device 1 along a line D-D in FIGS. 2A and 2B corresponds to the section shown in FIG. 1B.

The semiconductor device 1 includes a semiconductor substrate (not shown) provided with a semiconductor element such as a transistor, a capacitor or the like, and a fine interconnect structure formed on the semiconductor substrate. FIGS. 1A, 1B, 2A, and 2B are sectional views illustrating a part of the fine interconnect structure.

The semiconductor device 1 includes interconnects (wiring lines) $2a$, $2b$, and $2c$ formed above the semiconductor substrate, via plugs $3a$, $3b$, and $3c$ formed above the semiconductor substrate and electrically connected to lower surfaces of the interconnects $2a$, $2b$, and $2c$, hard masks $4a$, $4b$, and $4c$ formed on the interconnects $2a$, $2b$, and $2c$, a via layer insulator 5 formed above the semiconductor substrate and including the via plugs $3a$, $3b$, and $3c$, and an upper-layer insulating film 7 including air gaps $8a$ and $8b$. The layouts of the interconnects $2a$, $2b$, and $2c$ and via plugs $3a$, $3b$, and $3c$ are not limited to those of FIGS. 2A and 2B.

The interconnects $2a$, $2b$, and $2c$ are formed in the same layer. The via plugs $3a$, $3b$, and $3c$ electrically connect the interconnects $2a$, $2b$, and $2c$ to lower-layer conductive members (not shown), respectively. For example, the lower-layer conductive members are transistors or interconnects on the semiconductor substrate. A film which has a function of enhancing adhesiveness between the interconnects $2a$, $2b$, and 2c and the via layer insulator 5, such as a TiN film, a WN film or the like, may be formed on bottom surfaces of the interconnects 2a, 2b, and 2c.

Centers of the interconnects 2a, 2b, and 2c in a width direction (horizontal direction in FIGS. 2A and 2B) deviate from centers of the via plugs 3a, 3b, and 3c toward the width direction of the interconnects 2a, 2b, and 2c. The deviations result from the degree of alignment accuracy of lithography used to form the interconnects 2a, 2b, and 2c. The via plug 3b includes a recess part 10a under a region between the interconnect 2a and the interconnect 2b (in region which is not in contact with the interconnect 2b). The via plug 3c includes a recess part 10b under a region between the interconnect 2b and the interconnect 2c (in region which is not in contact with the interconnect 2c).

The via layer insulator 5 includes trenches 6a and 6b. The trenches 6a and 6b are formed under the region between the interconnect 2a and the interconnect 2b, and under the region between the interconnect 2b and the interconnect 2c, respectively.

The trenches 6a and 6b includes regions which are adjacent to the via plugs 3b and 3c in the width direction of the interconnects 2a, 2b, and 2c (see FIG. 1A), and regions which are not adjacent to the via plugs 3b and 3c in the width direction (see FIG. 1B).

The upper-layer insulating film 7 is formed on the interconnects 2a, 2b, and 2c to be buried in a region between the hard masks 4a and 4b, a region between the interconnects 2a and 2b, the recess part 10a, the trench 6a, a region between the hard masks 4b and 4c, a region between the interconnects 2b and 2c, the recess part 10b, and the trench 6b. The upper-layer insulating film 7 may be used as a via layer insulator of via plugs (not shown) electrically connected to upper surfaces of the interconnects 2a, 2b, and 2c.

The upper-layer insulating film 7 includes the air gaps 8a and 8b. Since the via layer insulator 5 includes the trenches 6a and 6b, the upper-layer insulating film 7 is deeply buried in the air gaps 8a and 8b, and the air gaps 8a and 8b are easily formed between the interconnects 2a and 2b, between the interconnects 2b and 2c, between the interconnect 2a and the via plug 3b, and between the interconnect 2b and the via plug 3c.

A dielectric breakdown and a current leakage generated between the adjacent conductive members are induced by hopping conduction of electrons in the insulating film between the conductive members. Therefore, the dielectric breakdown and the current leakage can be suppressed by forming the air gap between the conductive members. Furthermore, since the electric field concentration between the conductive members can be mitigated by forming the air gap between the conductive members, the dielectric breakdown and the current leakage can be suppressed. Additionally, an electric capacitance between the conductive members can be reduced by forming the air gap between the conductive members. Accordingly, in the first embodiment, the breakdown voltage characteristic and the leakage resistance characteristic can be improved and the electric capacitance can be reduced, between the interconnects 2a and 2b, between the interconnects 2b and 2c, between the interconnect 2a and the via plug 3b, and between the interconnect 2b and the via plug 3c.

As illustrated in FIGS. 1A and 2B, the air gap 8a (8b) is preferably included in not only the region that is not adjacent to the via plug 3b (3c) in the width direction of the interconnects 2a, 2b, and 2c in the trench 6a (6b), but also in the region that is adjacent to the via plug 3b (3c) in the width direction. This makes it possible to further improve the breakdown voltage characteristic and the leakage resistance characteristic of the interconnect structure.

The interconnects 2a, 2b, and 2c are made of conductive materials such as W, Al, Co, Ni, and Si. Preferably, the conductive materials can be processed by RIE (Reactive Ion Etching).

The via plugs 3a, 3b, and 3c are made of conductive materials such as W, Al, and Si. Preferably, the conductive materials can be processed by CVD (Chemical Vapor Deposition). The conductive materials for the via plugs 3a, 3b, and 3c may be different from the conductive materials for the interconnects 2a, 2b, and 2c.

The hard mask 4a, 4b, and 4c and the upper-layer insulating film 7 are made of insulating materials such as silicon oxide. The via layer insulator 5 is an insulator such as a TEOS (tetraethoxysilane) film.

As shown in FIGS. 2A and 2B, each of the interconnects 2a, 2b, and 2c has a line shape in a plan view, and each of the via plugs 3a, 3b, and 3c has a circular shape in a plan view. Also, as shown in FIGS. 2A and 2B, the interconnects 2a, 2b, and 2c are parallel to each other.

An example of a method of manufacturing the semiconductor device 1 of the first embodiment will be described below.

(Method of Manufacturing Semiconductor Device)

FIGS. 3A to 3F are vertical sectional views illustrating a method of manufacturing the semiconductor device 1 of the first embodiment.

Figure 3A:
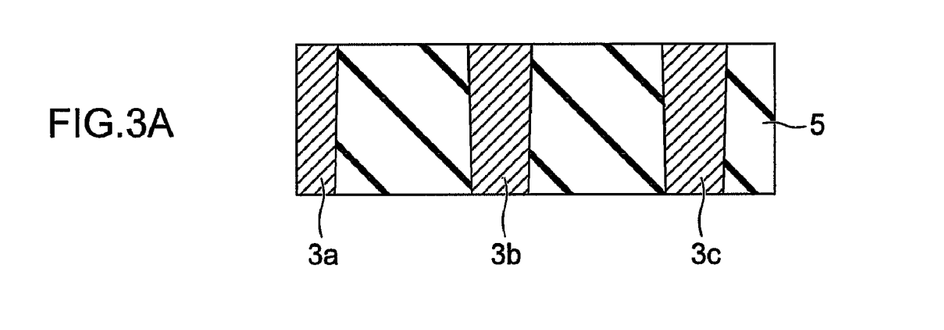
FIGS. 3A to 3F are vertical sectional views illustrating a method of manufacturing the semiconductor device of the first embodiment.

First, as illustrated in FIG. 3A, the via layer insulator 5 and the via plugs 3a, 3b, and 3c are formed above the semiconductor substrate (not shown).

The via layer insulator 5 such as a TEOS film is formed by CVD.

Via holes for the via plugs 3a, 3b, and 3c are formed in the via layer insulator 5 by patterning by lithography and etching by RIE or wet treatment. The metal film such as the W film is formed by CDV so that the via-holes are buried be the metal film, and the metal film out of the via-holes is then removed through CMP (Chemical Mechanical Polishing), thereby forming the via plugs 3a, 3b, and 3c.

Figure 3B:
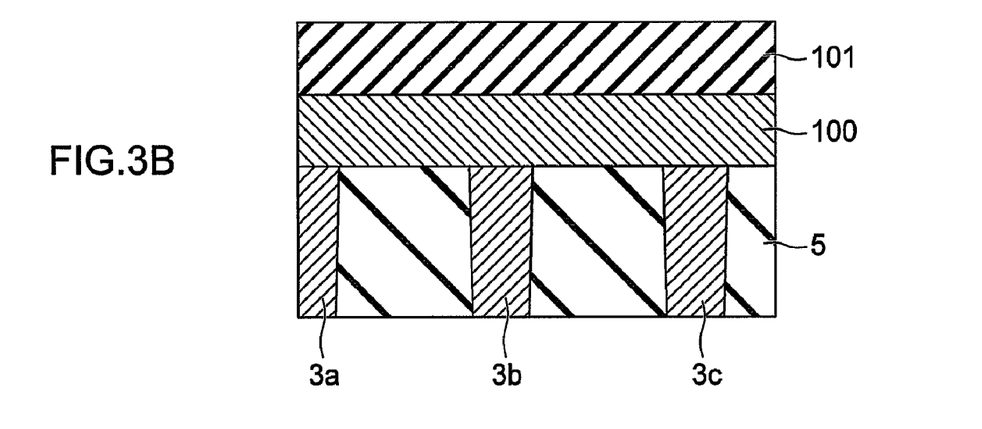

Then, as illustrated in FIG. 3B, a metal film 100 and a hard mask 101 are formed on the via layer insulator 5.

The metal film 100 such as the W film is formed by sputtering or CVD. However, when CVD is used to form the metal film 100, the metal film 100 easily captures an impurity. Therefore, sputtering is preferably used to form the metal film 100. After the metal film 100 is formed, a heat treatment may be performed in order to increase a grain size in the metal film 100.

The hard mask 101 such as the silicon oxide film is formed by plasma CVD.

The via plugs 3a, 3b, and 3c and the metal film 100 may simultaneously be formed from the same metal film. In such a case, CMP used to form the via plugs 3a, 3b, and 3c are not necessary.

Figure 3C:
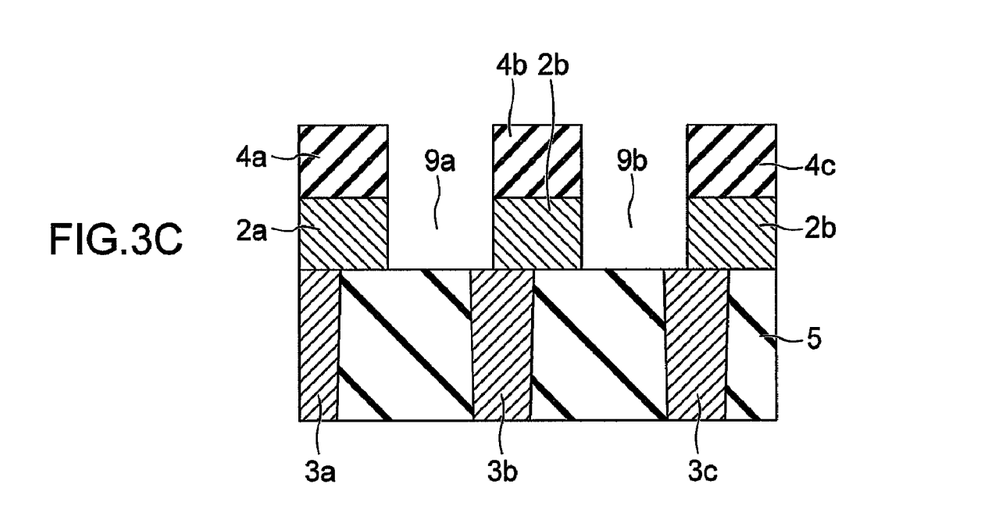

Then, as illustrated in FIG. 3C, the hard masks 4a, 4b, and 4c and the interconnects 2a, 2b, and 2c are formed. At this point, the region between the interconnects 2a and 2b and the region between interconnects 2b and 2c are shown as a region 9a between interconnects and a region 9b between interconnects, respectively.

The hard mask 101 is patterned by lithography and RIE to form the hard masks 4a, 4b, and 4c.

The interconnects 2a, 2b, and 2c are formed by patterning the metal film 100. The patterning is performed by RIE with a process gas containing Cl (chlorine) by using the hard masks 4a, 4b, and 4c as a mask.

Figure 3D:
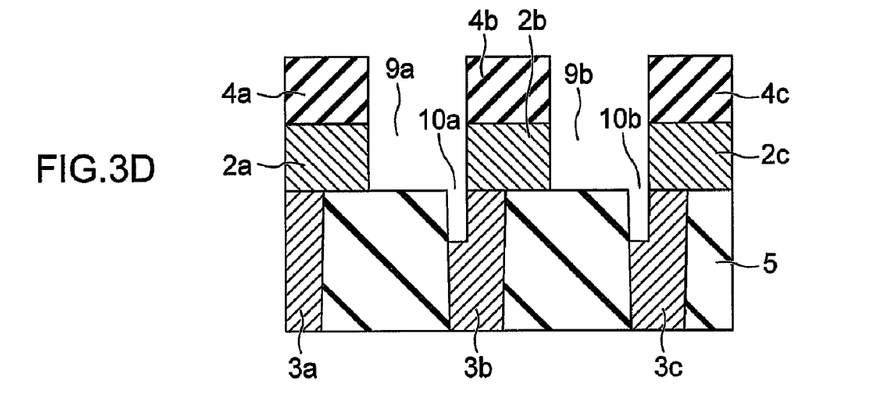

Then, as illustrated in FIG. 3D, overetching is performed in order to prevent short circuits among the interconnects 2a, 2b, and 2c.

Therefore, the region of the via plug 3b exposed to the bottom of the region 9a between interconnects, and the region of the via plug 3c exposed to the bottom of the region 9b between interconnects, are etched to form the recess parts 10a and 10b in the via plugs 3b and 3c, respectively.

Figure 3E:
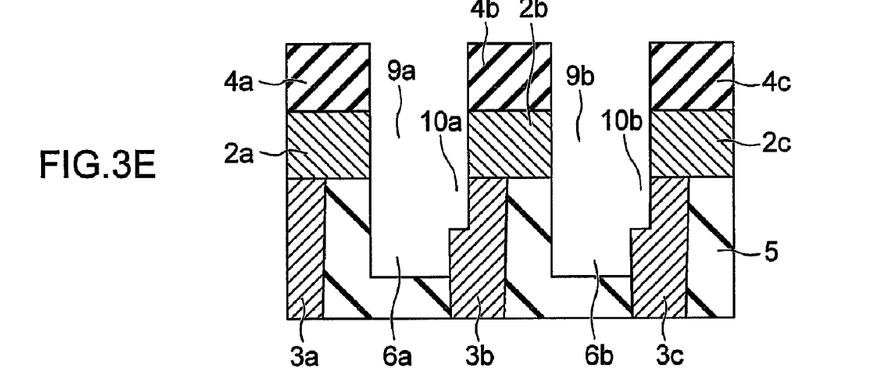

Then, as illustrated in FIG. 3E, the via layer insulator 5 is etched to form the trenches 6a and 6b in the via layer insulator 5. The trenches 6a and 6b are formed more deeply than the recess parts 10a and 10b. At this point, upper portions of the hard masks 4a, 4b, and 4c may be etched.

Figure 3F:
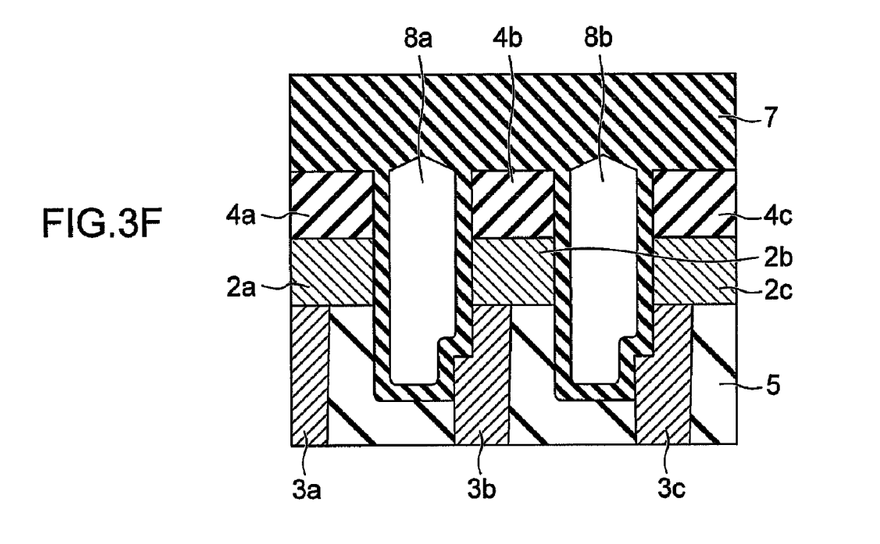

Then, as illustrated in FIG. 3F, the upper-layer insulating film 7 is formed so that the trenches 6a and 6b, the recess parts 10a and 10b, and the regions 9a and 9b between interconnects are buried by the upper-layer insulating film 7.

The upper-layer insulating film 7 is formed by plasma CVD so as to include the air gaps 8a and 8b at a relatively high deposition rate on a condition of a bad covering property. In the first embodiment, the position of the bottom of the air gap 8a (8b) on the interconnect 2a (2b) side tends to be lower than the position of the bottom of the air gap 8a (8b) on the interconnect 2b (2c) side.

(Second Embodiment)

A second embodiment differs from the first embodiment in that an oxidation resistant film is formed on side surfaces of the interconnects 2a, 2b, and 2c in order to prevent the oxidation.

Figure 4A:
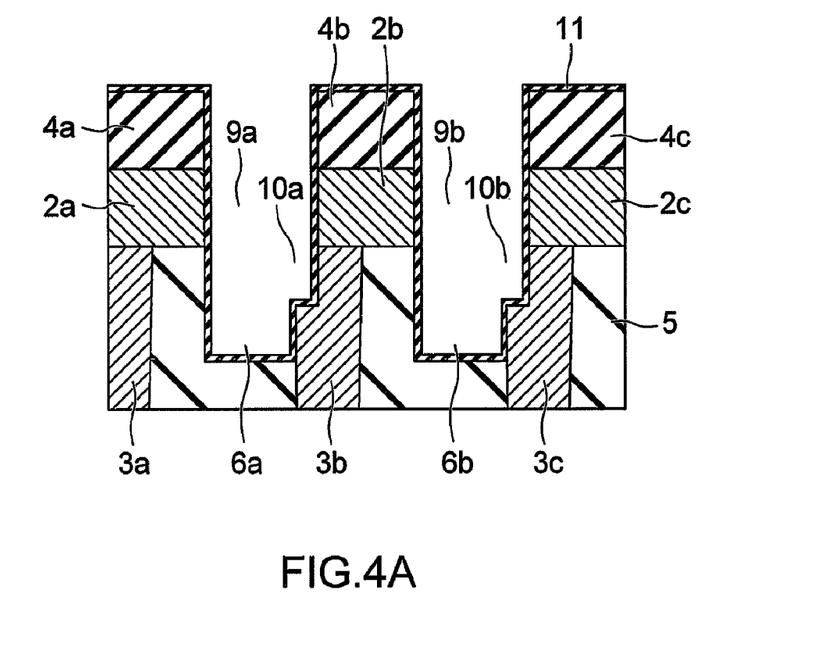
FIGS. 4A and 4B are vertical sectional views illustrating a method of manufacturing a semiconductor device of a second embodiment.
Figure 4B:
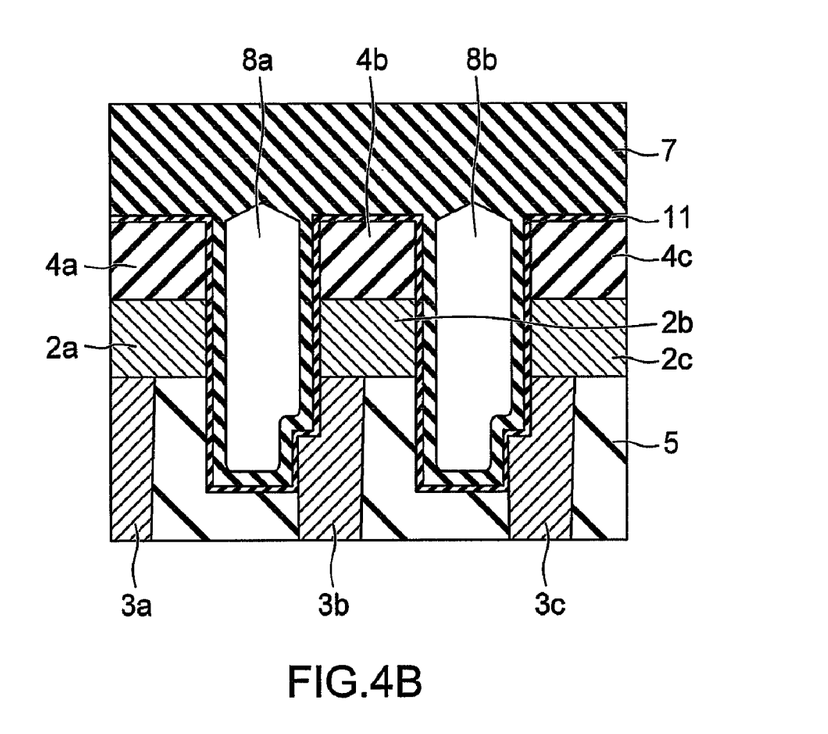

FIGS. 4A and 4B are vertical sectional views illustrating a method of manufacturing a semiconductor device of the second embodiment.

First, as illustrated in FIGS. 3A to 3E, the processes similar to those of the first embodiment are performed to form the trenches 6a and 6b.

Then, as illustrated in FIG. 4A, an oxidation resistant film 11 is formed in the whole surface of the semiconductor substrate so that the side surfaces of the interconnects 2a, 2b, and 2c are covered with the oxidation resistant film 11. For example, the oxidation resistant film 11 is a silicon nitride film formed by CVD.

The oxidation of the interconnects 2a, 2b, and 2c, which is caused by the oxidation agent contained in a process gas for the interconnects 2a, 2b, and 2c or the upper-layer insulating film 7, can be suppressed by forming the oxidation resistant film 11.

Preferably, the whole or lower portions of the hard masks 4a, 4b, and 4c are made of a material which can suppress the oxidation of the interconnects 2a, 2b, and 2c, such as silicon nitride.

Then, as illustrated in FIG. 4B, the upper-layer insulating film 7 is buried in the trenches 6a and 6b, the recess parts 10a and 10b, and the regions 9a and 9b between interconnects.

(Third Embodiment)

A third embodiment differs from the first embodiment in that oxidation resistant films are formed on upper surfaces and side surfaces of the interconnects 2a, 2b, and 2c in order to prevent the oxidation.

FIGS. 5A to 5E are vertical sectional views illustrating a method of manufacturing a semiconductor device of the third embodiment.

First, as illustrated in FIG. 3A, the processes similar to those of the first embodiment are performed to form the via plugs 3a, 3b, and 3c.

Figure 5A:
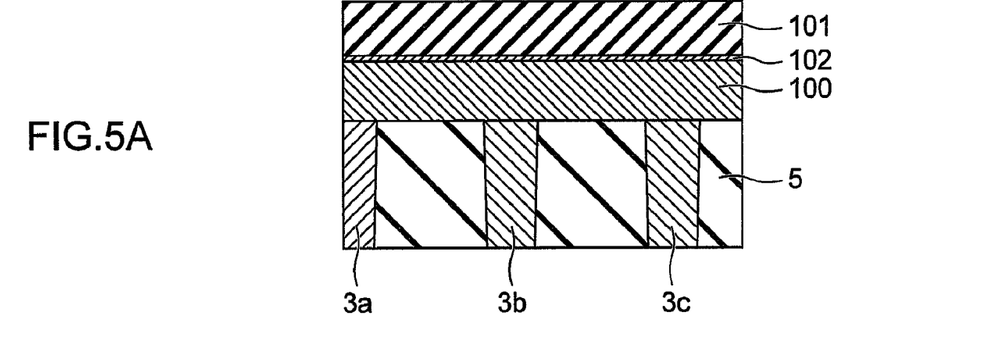
FIGS. 5A to 5E are vertical sectional views illustrating a method of manufacturing a semiconductor device of a third embodiment.

Then, as illustrated in FIG. 5A, the metal film 100, an oxidation resistant film 102, and the hard mask 101 are formed on the via layer insulator 5.

The oxidation resistant film 102 is a metal film such as an Al or Ti film, in which a stable oxide layer I formed. The oxidation resistant film 102 has a thickness of about 2 nm. The oxidation resistant film 102 is an example of the first oxidation resistant film of the disclosure.

Figure 5B:
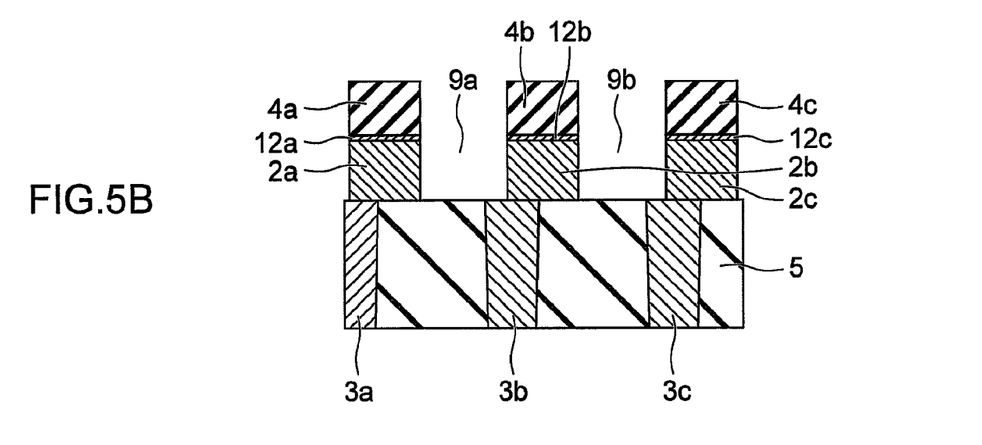

Then, as illustrated in FIG. 5B, the hard masks 4a, 4b, and 4c, the oxidation resistant films 12a, 12b, and 12c, and the interconnects 2a, 2b, and 2c are formed.

The oxidation resistant films 12a, 12b, and 12c are formed by patterning the oxidation resistant film 102. The patterning is performed by using the hard masks 4a, 4b, and 4c as a mask.

Figure 5C:
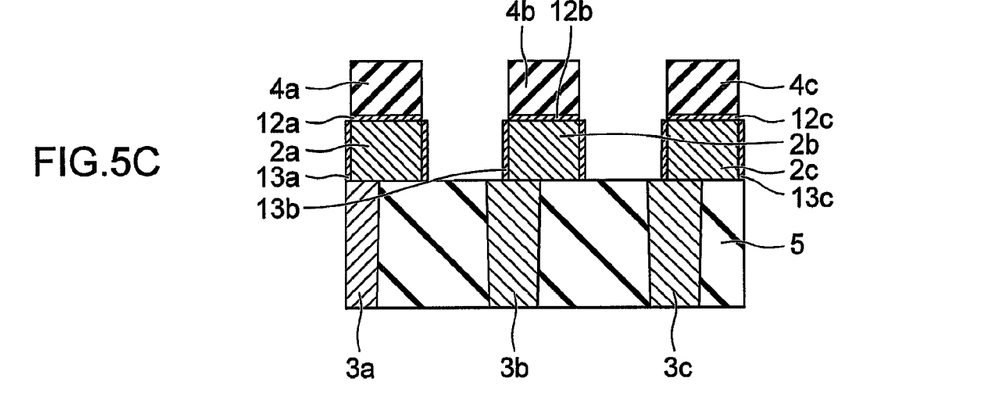

Then, as illustrated in FIG. 5C, the oxidation resistant films 13a, 13b, and 13c are formed on the side surfaces of the interconnects 2a, 2b, and 2c, respectively. The oxidation resistant films 13a, 13b, and 13c are metal films such as an Al or Ti film, in which a stable oxide layer is formed. The oxidation resistant films 13a, 13b, and 13c have a thickness of about 2 nm. The oxidation resistant films 13a, 13b, and 13c are selectively formed on the side surfaces of the interconnects 2a, 2b, and 2c by selective CVD. The oxidation resistant films 13a, 13b, and 13c are an example of the second oxidation resistant film of the disclosure.

The oxidation of the interconnects 2a, 2b, and 2c, which is caused by the oxidation agent contained in the process gas for the interconnects 2a, 2b, and 2c or the upper-layer insulating film 7, can be suppressed by forming the oxidation resistant films 12a, 12b, and 12c and the oxidation resistant films 13a, 13b, and 13c.

Figure 5D:
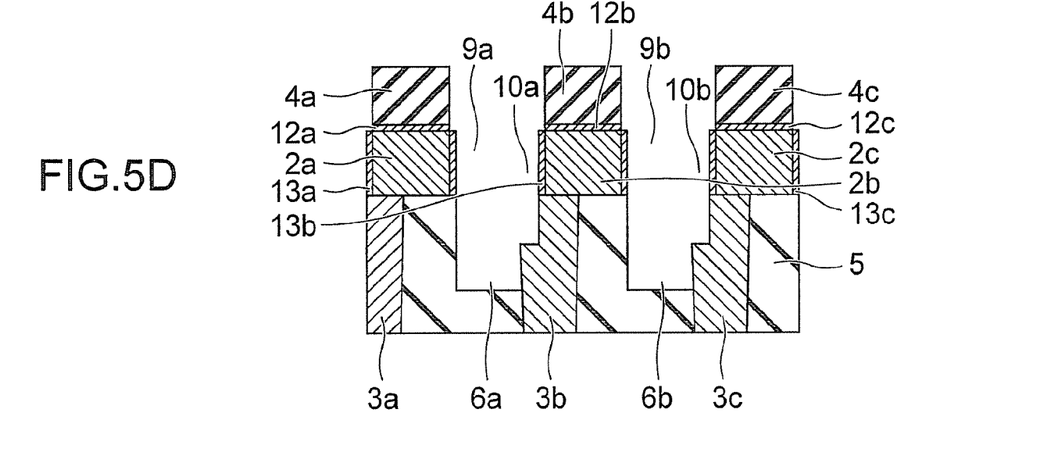

Then, as illustrated in FIG. 5D, the recess parts 10a and 10b and the trenches 6a and 6b are formed through the processes similar to those of the first embodiment.

Figure 5E:
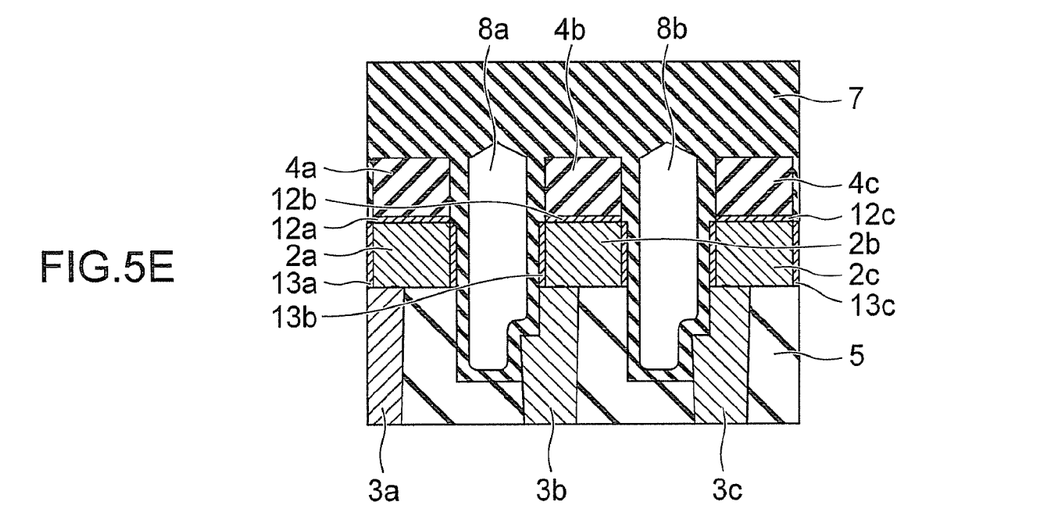

Then, as illustrated in FIG. 5E, the upper-layer insulating film 7 is buried in the trenches 6a and 6b, the recess parts 10a and 10b, and the regions 9a and 9b between interconnects.

(Fourth Embodiment)

A fourth embodiment differs from the first embodiment in that a rounding process is performed to regions under the recess parts 10a and 10b of the via plugs 3b and 3c.

Figure 6A:
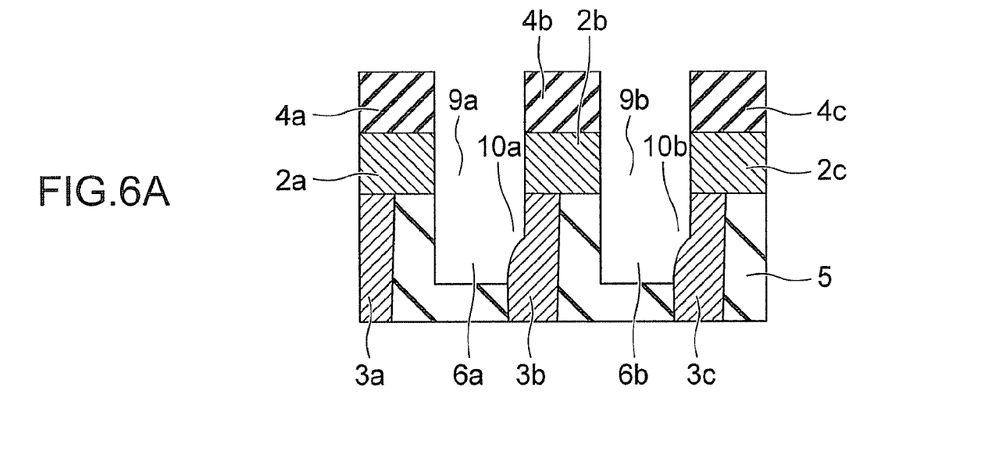
FIGS. 6A and 6B are vertical sectional views illustrating a method of manufacturing a semiconductor device of a fourth embodiment.
Figure 6B:
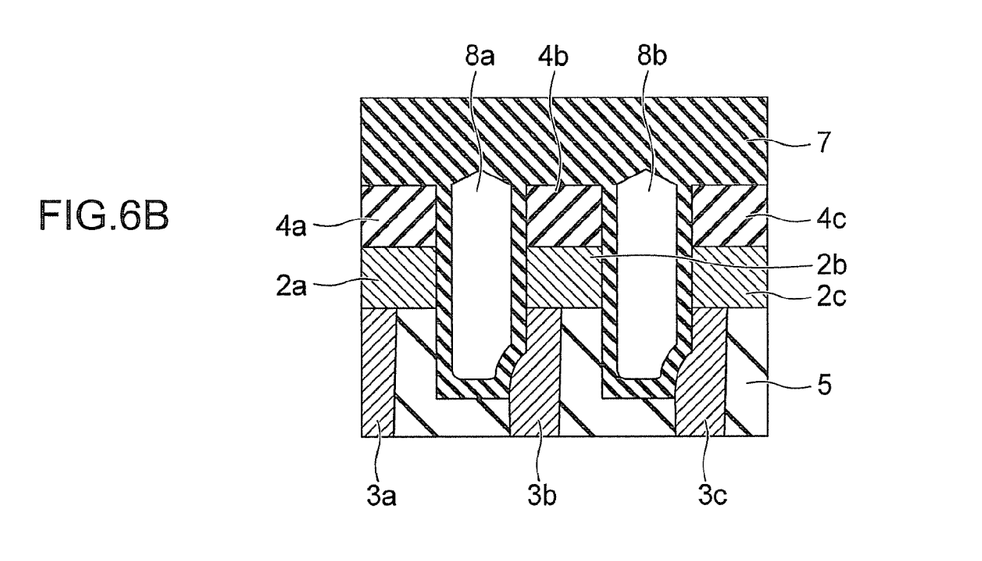

FIGS. 6A and 6B are vertical sectional views illustrating a method of manufacturing a semiconductor device of the fourth embodiment.

First, as illustrated in FIGS. 3A to 3E, the processes similar to those of the first embodiment are performed to form the trenches 6a and 6b.

Then, as illustrated in FIG. 6A, the rounding process is performed to the regions under the recess parts 10a and 10b of the via plugs 3b and 3c.

When the via plugs 3b and 3c exposed to the trenches 6a and 6b and the recess parts 10a and 10b have the round shapes, the electric field concentration is mitigated around the via plugs 3b and 3c, so that the breakdown voltage characteristic and the leakage resistance characteristic are improved between the interconnect 2a and the via plug 3b and between the interconnect 2b and the via plug 3c.

Then, as illustrated in FIG. 6B, the upper-layer insulating film 7 is formed to be buried in the trenches 6a and 6b, the recess parts 10a and 10b, and the regions 9a and 9b between interconnects.

(Fifth Embodiment)

A fifth embodiment of the invention differs from the first embodiment in that the hard masks 4a, 4b, and 4c are removed before the upper-layer insulating film 7 is formed.

Figure 7A:
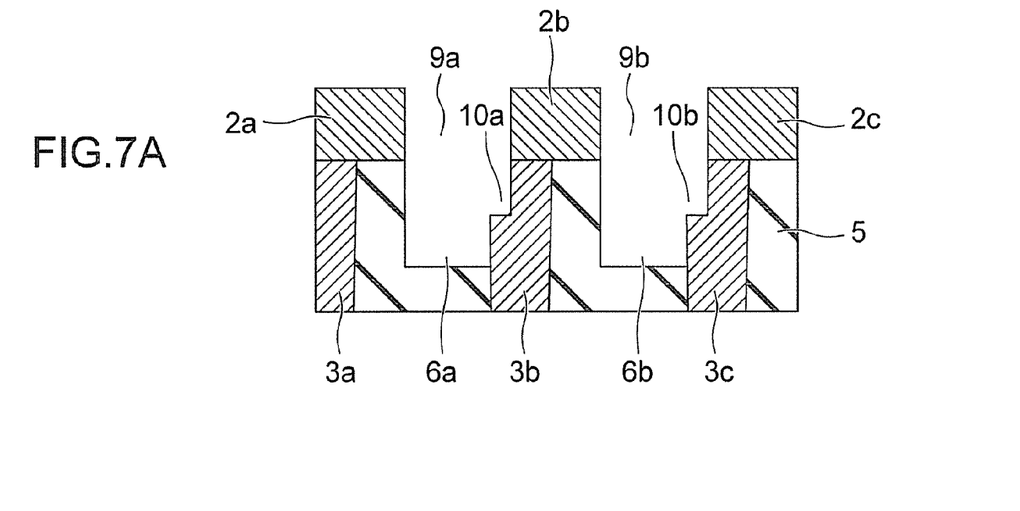
FIGS. 7A and 7B are vertical sectional views illustrating a method of manufacturing a semiconductor device of a fifth embodiment.
Figure 7B:
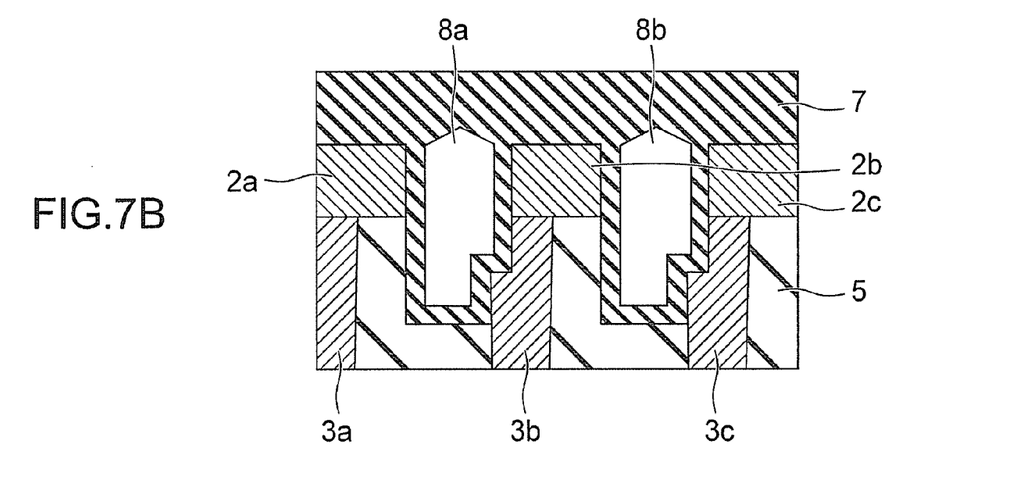

FIGS. 7A and 7B are vertical sectional views illustrating a method of manufacturing a semiconductor device of the fifth embodiment.

First, as illustrated in FIGS. 3A to 3D, the processes similar to those of the first embodiment are performed to form the recess parts 10a and 10b.

Then, as illustrated in FIG. 7A, the via layer insulator 5 is etched to form the trenches 6a and 6b in the via layer insulator 5. At this point, the hard masks 4a, 4b, and 4c are removed at the same time as the trenches 6a and 6b are formed. In the fifth embodiment, the hard masks 4a, 4b, and 4c are made of a material similar to that of the via layer insulator 5 (for example, oxide silicon). The hard masks 4a, 4b, and 4c may be removed after the trenches 6a and 6b are formed.

Then, as illustrated in FIG. 7B, the upper-layer insulating film 7 is formed to be buried in the trenches 6a and 6b, the recess parts 10a and 10b, and the regions 9a and 9b between interconnects.

When the hard masks 4a, 4b, and 4c remain, the hard masks 4a, 4b, and 4c and the interconnects 2a, 2b, and 2c may incline or collapse due to a film stress generated in forming the upper-layer insulating film 7, which results in a risk of generating a short circuit between interconnects. In the fifth embodiment, an influence of the film stress of the upper-layer insulating film 7 is reduced by removing the hard masks 4a, 4b, and 4c, so that the inclinations of the interconnects 2a, 2b, and 2c can be suppressed.

(Sixth Embodiment)

A sixth embodiment differs from the first embodiment in the shapes of the air gaps 8a and 8b.

Figure 8A:
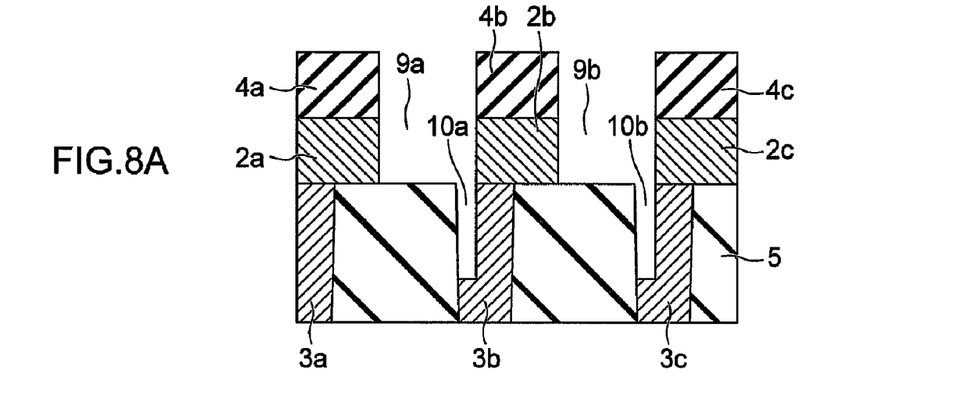
FIGS. 8A to 8C are vertical sectional views illustrating a method of manufacturing a semiconductor device of a sixth embodiment.
Figure 8B:
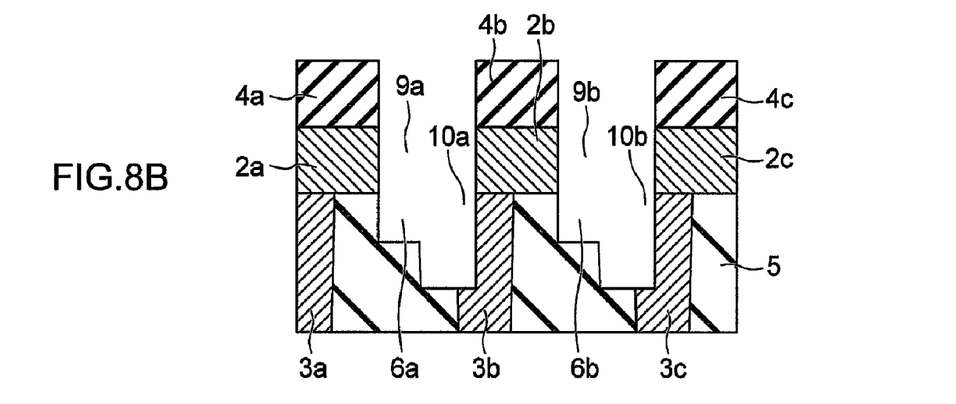
Figure 8C:
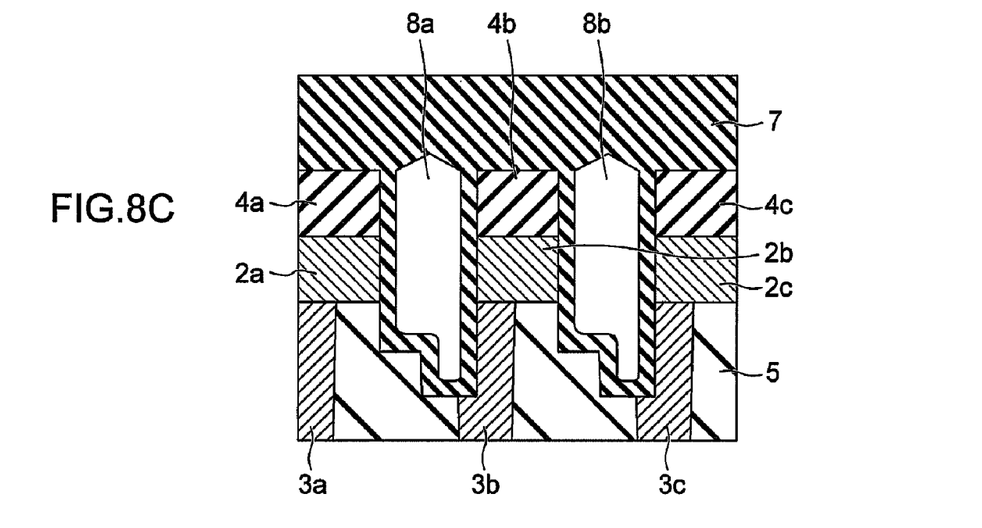

FIGS. 8A to 8C are vertical sectional views illustrating a method of manufacturing a semiconductor device of the sixth embodiment.

First, as illustrated in FIGS. 3A to 3C, the processes similar to those of the first embodiment are performed to form the interconnects 2a, 2b, and 2c.

Then, as illustrated in FIG. 8A, the recess parts 10a and 10b are formed in the via plugs 3b and 3c by etching.

Then, as illustrated in FIG. 8B, the via layer insulator 5 is etched to form the trenches 6a and 6b in the via layer insulator 5. The trenches 6a and 6b are formed more shallowly than the recess parts 10a and 10b.

Then, as illustrated in FIG. 8C, the upper-layer insulating film 7 is formed to be buried in the trenches 6a and 6b, the recess parts 10a and 10b, and the regions 9a and 9b between interconnects. In the sixth embodiment, the position of the bottom of the air gap 8a (8b) on the interconnect 2b (2c) side tends to be lower than the position of the bottom of the air gap 8a (8b) on the interconnect 2a (2b) side.

(Seventh Embodiment)

A seventh embodiment of the invention differs from the first embodiment in that the upper-layer insulating film 7 is not formed or hardly formed in the regions 9a and 9b between interconnects, the trenches 6a and 6b, and the recess parts 10a and 10b.

Figure 9:
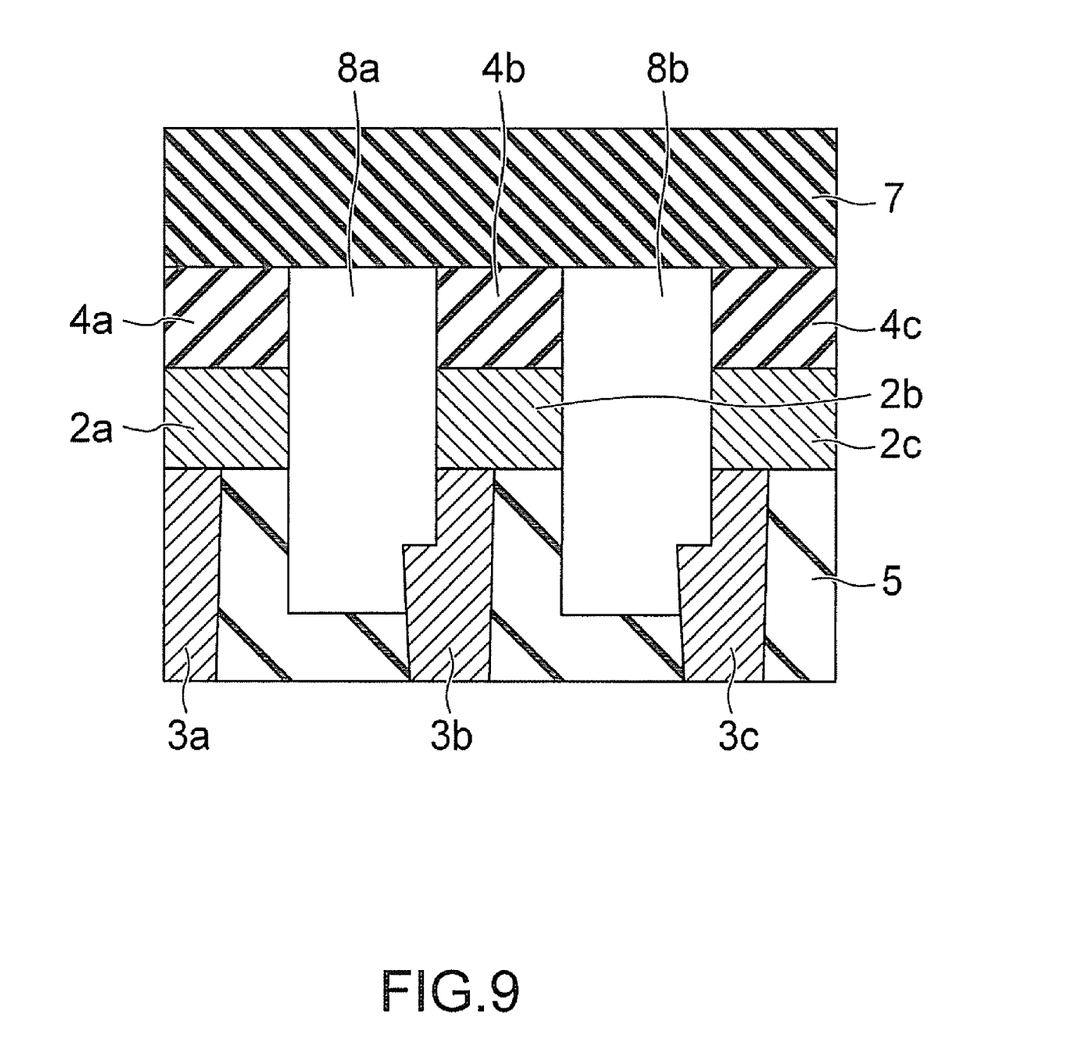
FIG. 9 is a vertical sectional view illustrating a method of manufacturing a semiconductor device of a seventh embodiment.

FIG. 9 is a vertical sectional view illustrating a method of manufacturing a semiconductor device of the seventh embodiment.

First, as illustrated in FIGS. 3A to 3E, the processes similar to those of the first embodiment are performed to form the trenches 6a and 6b.

Then, as illustrated in FIG. 9, the upper-layer insulating film 7 is formed by a coating method. A liquid coating film is formed on the hard masks 4a, 4b, and 4c by spin coating, and the liquid coating film is heated to obtain the upper-layer insulating film 7.

The upper-layer insulating film 7 can be formed by adjusting a concentration and viscosity of chemical, a rotating speed of the spin coating and the like so that the regions 9a and 9b between interconnects, the trenches 6a and 6b, and the recess parts 10a and 10b are hardly buried by the upper-layer insulating film 7. This makes it possible to increase volumes of the air gaps 8a and 8b, thereby improving the breakdown voltage characteristic and the leakage resistance characteristic of the interconnect structure.

(Eighth Embodiment)

An eighth embodiment illustrates an interconnect structure in a region where fine interconnects are used and an interconnect structure in a region where wide interconnects are used.

Figure 10:
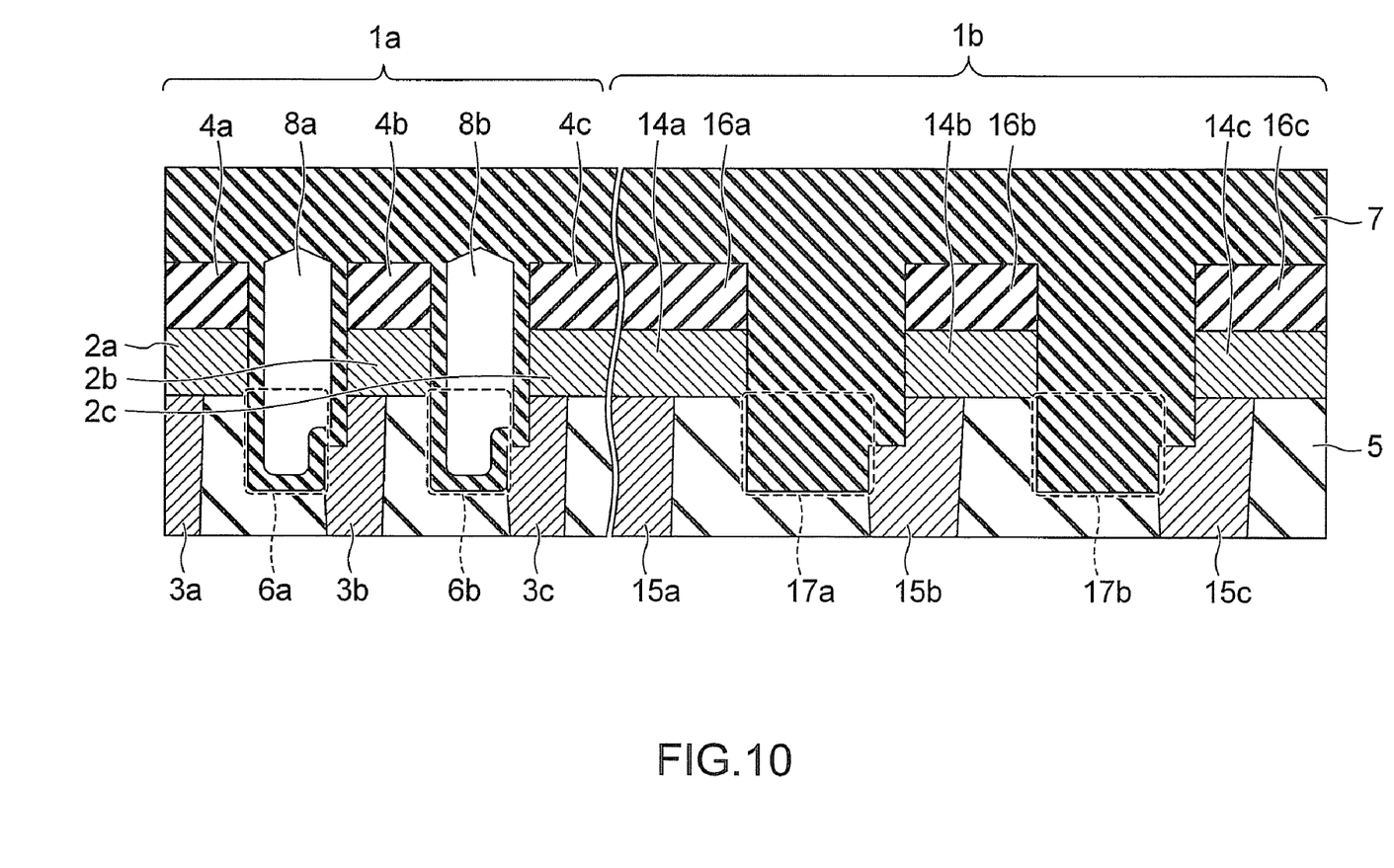
FIGS. 10 and 11 are vertical sectional views illustrating a semiconductor device of an eighth embodiment.

FIG. 10 is a vertical sectional view illustrating a semiconductor device of the eighth embodiment. The semiconductor device 1 of the eighth embodiment includes regions 1a and 1b.

The region 1a such a region that the fine interconnects are used. The region 1a has the interconnect structure similar to that of the semiconductor device 1 of the first embodiment. For example, the region 1a an interconnect region which is electrically connected to an element region where a memory device is formed.

The region 1b is such a region where the relatively wide interconnects are used. For example, the region 1b is an interconnect region which is electrically connected to a peripheral control circuit region of the memory device.

The region 1b includes interconnects 14a, 14b, and 14c formed above the semiconductor substrate, via plugs 15a, 15b, and 15c formed above the semiconductor substrate and electrically connected to the lower surfaces of the interconnects 14a, 14b, and 14c, and hard masks 16a, 16b, and 16c formed on the interconnects 14a, 14b, and 14c. The via layer insulator 5 and the upper-layer insulating film 7 are formed in the regions 1a and 1b.

Similarly to the interconnects 2a, 2b, and 2c and the via plugs 3a, 3b, and 3c, each of the interconnects 14a, 14b, and 14c has a line shape in a plan view, and each of the via plugs 15a, 15b, and 15c has a circular shape in a plan view. Also, the interconnects 14a, 14b, and 14c are parallel to each other.

The interconnects 14a, 14b, and 14c are wider than the interconnects 2a, 2b, and 2c. Furthermore, the width between the interconnects 14a and 14b and the width between the interconnects 14b and 14c are 100 nm or more, for example. In this manner, the width between the interconnects 14a and 14b and the width between the interconnects 14b and 14c are larger than the width between the interconnects 2a and 2b and the width between the interconnects 2b and 2c.

Trenches 17a and 17b in the region 1b of the via layer insulator 5 are formed through the same processes as the trenches 6a and 6b, and the trenches 17a and 17b are wider than the trenches 6a and 6b.

Therefore, the upper-layer insulating film 7 can be formed by controlling the deposition condition so that the region 1b does not include or hardly includes the air gap. Since a step may be generated on the surface of the upper-layer insulating film 7 between the regions 1a and 1b, the upper surface of the upper-layer insulating film 7 is preferably planarized through CMP.

Figure 11:
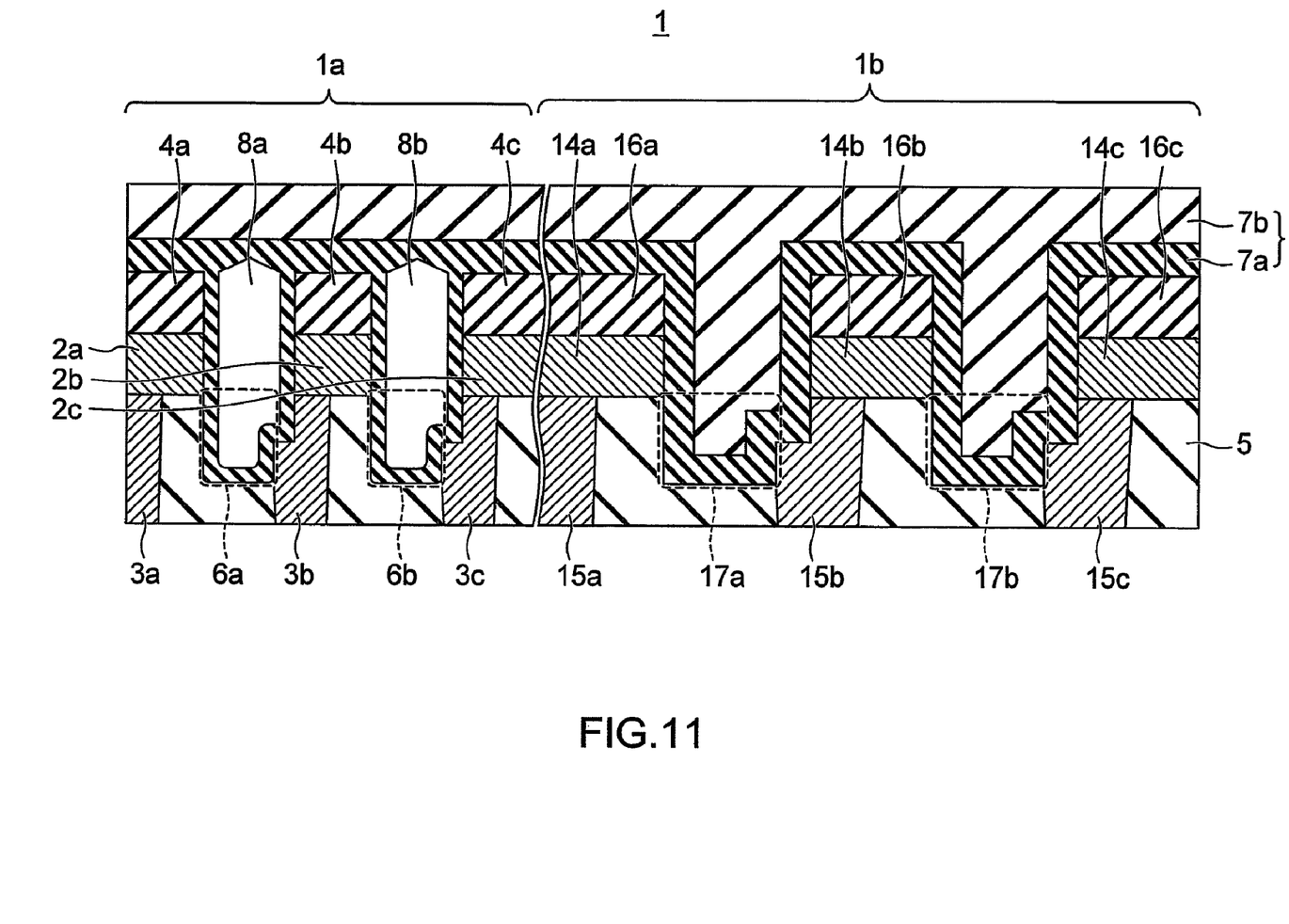

On the other hand, as illustrated in FIG. 11, the upper-layer insulating film 7 including different kinds of stacked insulating films 7a and 7b may be used. The insulating film 7a is formed by using a material having bad covering property or under a deposition condition of the bad covering property. The insulating film 7b is formed by using a material having good covering property or under a deposition condition of the good covering property. After the air gaps 8a and 8b are formed in the region 1a by using the insulating film 7a having the bad covering property, the trench of the insulating film 7a in the region 1*b* can be filled with the insulating film 7*b* having the good covering property without forming the air gap. Since the tops of the air gaps 8*a* and 8*b* are closed by the insulating film 7*a*, the insulating film 7*b* does not enter into the air gaps 8*a* and 8*b*.

The air gap is formed only in the region 1*a*, and no air gap is formed in the region 1*b* where the dielectric breakdown or the leakage current is hardly generated because of the large distance between the interconnects. This makes it possible to suppress a decrease in mechanical strength of the interconnect structure due to the air gap.

According to the first to eighth embodiments, the upper-layer insulating film 7 including the air gaps 8*a* and 8*b* is formed in the trenches 6*a* and 6*b* of the via layer insulator 5. Therefore, the air gaps 8*a* and 8*b* can be efficiently formed, the breakdown voltage characteristic and the leakage resistance characteristic of the interconnect structure can be further improved, and the electric capacitance can be reduced.

The interconnects 2*a*, 2*b*, and 2*c* are not damascene interconnects, but the interconnects formed by using the patterning by RIE. Therefore, the interconnects 2*a*, 2*b*, and 2*c* are typically formed into a taper shape of trapezoid in a cross section. In this case, since an acute angle is formed between the bottom surface and the side surface, the dielectric breakdown and the leakage current are easily generated. Therefore, in this case, the effects of the first to eighth embodiments are increasingly necessary to improve the breakdown voltage characteristic and the leakage resistance characteristic.

The procedure of the manufacturing process of the semiconductor device is not limited to the above described embodiments.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

The invention claimed is:

1. A semiconductor device comprising:
   a substrate provided with a semiconductor element;
   first and second interconnects provided above the substrate, each of the first and second interconnects having a line shape in a plan view, and the first and second interconnects being substantially parallel to each other;
   a first via plug provided above the substrate, electrically connected to a lower surface of the first interconnect on a second interconnect side, and including a first recess part at an upper end of the first via plug under a first region between interconnects, the first region between interconnects being a region between the first interconnect and the second interconnect; and
   a via layer insulator provided above the substrate and including the first via plug, and a first trench under the first region between interconnects, the first trench including a region adjacent to the first via plug in a width direction of the first and second interconnects,
   wherein an air gap is included in the first region between interconnects and in the first trench.

2. The device of claim 1, wherein
the first trench includes a region which is not adjacent to the first via plug in the width direction.

3. The device of claim 1, further comprising:
an insulating film provided in the first region between interconnects, the first recess part, and the first trench, and including the air gap.

4. The device of claim 1, further comprising:
an oxidation resistant film provided on side surfaces of the first and second interconnects.

5. The device of claim 1, further comprising:
a first oxidation resistant film provided on upper surfaces of the first and second interconnects; and
a second oxidation resistant film provided on side surfaces of the first and second interconnects.

6. The device of claim 1, wherein
the first recess part has a round shape in a vertical cross section of the first recess part.

7. The device of claim 1, wherein
a height of a bottom of the air gap on a first interconnect side is higher than a height of a bottom of the air gap on a second interconnect side.

8. The device of claim 1, wherein
a height of a bottom of the air gap on a first interconnect side is lower than a height of a bottom of the air gap on a second interconnect side.

9. The device of claim 1, wherein
side surfaces of the first and second interconnects on a first region side are exposed to the air gap.

10. The device of claim 1, further comprising:
third and fourth interconnects provided above the substrate, each of the third and fourth interconnects having a line shape in a plan view, the third and fourth interconnects being substantially parallel to each other, and a distance between the third and fourth interconnects being longer than a distance between the first and second interconnects; and
a second via plug provided above the substrate, electrically connected to a lower surface of the third interconnect on a fourth interconnect side, and including a second recess part at an upper end of the second via plug under a second region between interconnects, the second region between interconnects being a region between the third interconnect and the fourth interconnect,
wherein
the via layer insulator includes the second via plug, and a second trench under the second region between interconnects, the second trench including a region adjacent to the second via plug in a width direction of the third and fourth interconnects, and
no air gap is included in the second region between interconnects and in the second trench.

11. The device of claim 10, wherein
the distance between the third and fourth interconnects is equal to or longer than 100 nm.

12. The device of claim 10, wherein the second region between interconnects and the second trench are buried by:
a first insulating film formed of the same insulating material as the insulating film including the air gap; and
a second insulating film provided on the first insulating film.

13. A method of manufacturing a semiconductor device, the method comprising:
forming a via layer insulator including a via plug above a substrate which is provided with a semiconductor element;
forming a metal film on the via layer insulator;
patterning the metal film to form a first interconnect electrically connected to the via plug, and to form a second interconnect;

forming a recess part at an upper end of the via plug under a region between interconnects, the region between interconnects being a region between the first interconnect and the second interconnect;

forming a trench in a region of the via layer insulator under the region between interconnects; and forming an insulating film on the first and second interconnects so that an air gap is included in the region between interconnects and in the trench.

14. The method of claim 13, further comprising:

forming an oxidation resistant film in the region between interconnects and in the trench to cover side surfaces of the first and second interconnects, before the insulating film is formed.

15. The method of claim 13, further comprising:

forming a first oxidation resistant film on an upper surface of the metal surface, before the metal film is patterned; and forming a second oxidation resistant film on side surfaces of the first and second interconnects, before the recess part is formed.

16. The method of claim 13, wherein the first recess part is formed to have a round shape in a vertical cross section of the first recess part.

17. The method of claim 13, wherein the metal film is patterned by using a hard mask formed on the metal film, and the hard mask is removed simultaneously with or after the formation of the trench.

18. The method of claim 13, wherein the trench is formed so that a height of a bottom of the trench on a first interconnect side becomes higher than a height of a bottom of the trench on a second interconnect side.

19. The method of claim 13, wherein the trench is formed so that a height of a bottom of the trench on a first interconnect side becomes lower than a height of a bottom of the trench on a second interconnect side.

20. The method of claim 13, wherein the insulating film is formed so that side surfaces of the first and second interconnect are exposed to the air gap.

* * * * *